(12) United States Patent
Yu et al.

(10) Patent No.: US 11,757,257 B2
(45) Date of Patent: Sep. 12, 2023

(54) SIGESN LASER DIODES AND METHOD OF FABRICATING SAME

(71) Applicant: BOARD OF TRUSTEES OF THE UNIVERSITY OF ARKANSAS, Little Rock, AR (US)

(72) Inventors: Shui-Qing Yu, Fayetteville, AR (US); Yiyin Zhou, Fayetteville, AR (US); Wei Du, Dallas, PA (US)

(73) Assignee: BOARD OF TRUSTEES OF THE UNIVERSITY OF ARKANSAS, Little Rock, AR (US)

(*) Notice: Subject to any disclaimer, the term of this patent is extended or adjusted under 35 U.S.C. 154(b) by 122 days.

(21) Appl. No.: 17/487,140

(22) Filed: Sep. 28, 2021

(65) Prior Publication Data
US 2022/0102942 A1    Mar. 31, 2022

Related U.S. Application Data

(60) Provisional application No. 63/084,207, filed on Sep. 28, 2020.

(51) Int. Cl.
| | | |
|---|---|---|
| *H01S 5/00* | (2006.01) | |
| *H01S 5/32* | (2006.01) | |
| *H01S 5/34* | (2006.01) | |
| *H01S 5/02* | (2006.01) | |
| H01S 5/042 | (2006.01) | |
| H01S 5/30 | (2006.01) | |

(52) U.S. Cl.
CPC .............. *H01S 5/322* (2013.01); *H01S 5/021* (2013.01); *H01S 5/3223* (2013.01); *H01S 5/3427* (2013.01); H01S 5/04256 (2019.08); H01S 5/3054 (2013.01); H01S 5/3077 (2013.01); H01S 5/32 (2013.01); H01S 5/3407 (2013.01); H01S 5/3426 (2013.01)

(58) Field of Classification Search
CPC ........ H01S 5/322; H01S 5/021; H01S 5/3223; H01S 5/3427; H01S 5/32
See application file for complete search history.

(56) References Cited

U.S. PATENT DOCUMENTS

| | | | | |
|---|---|---|---|---|
| 5,548,128 A | * | 8/1996 | Soref | ...................... H01L 33/06 257/190 |
| 6,897,471 B1 | * | 5/2005 | Soref | .................... H01L 29/155 257/14 |
| 7,603,016 B1 | * | 10/2009 | Soref | .................... B82Y 20/00 385/129 |

(Continued)

OTHER PUBLICATIONS

S. Wirths, D. Buca, S. Mantl, Si—Ge—Sn alloys: From growth to applications, Prog. Cryst. Growth Ch. 62, 1-39 (2016).

(Continued)

*Primary Examiner* — Kinam Park
(74) *Attorney, Agent, or Firm* — Locke Lord LLP; Tim Tingkang Xia, Esq.

(57) ABSTRACT

A laser diode including a double heterostructure comprising a top layer, a buffer layer formed on a substrate, and an intrinsic active layer formed between the top layer and the buffer layer. The top layer and the buffer layer have opposite types of conductivity. The active layer has a bandgap smaller than that of the buffer layer or the top layer. The double heterostructure includes Ge, SiGe, GeSn, and/or SiGeSn materials.

28 Claims, 8 Drawing Sheets

(56) References Cited

U.S. PATENT DOCUMENTS

| | | | |
|---|---|---|---|
| 2015/0014632 A1* | 1/2015 | Kim | H01L 29/66318 438/312 |
| 2015/0102465 A1* | 4/2015 | Chen | H01L 21/02532 438/492 |
| 2016/0189958 A1* | 6/2016 | Mosleh | C30B 25/02 438/478 |
| 2019/0296131 A1* | 9/2019 | Kim | H01L 29/1004 |

OTHER PUBLICATIONS

R. Soref, D. Buca, and S.-Q. Yu, Group IV Photonics: Driving Integrated Optoelectronics, Optics and Photonics News 27, 32-39 (2016).

J. Zheng, et al., Recent progress in GeSn growth and GeSn-based photonic devices, J. Semicond. 39, 061006 (2018).

R. Soref, Mid-infrared photonics in silicon and germanium, Nature Photon. 4, 495-497 (2010).

X. Wang and J, Liu, Emerging technologies in Si active photonics. J. Semicond. 39, 061001 (2018).

S. Wirths, et al., Lasing in direct-bandgap GeSn alloy grown on Si. Nature Photon. 9, 88-92 (2015).

V. Reboud, et al., Optically pumped GeSn micro-disks with 16% Sn lasing at 3.1 μm up to 180 K, Appl. Phys. Lett. 111, 092101 (2017).

J. Margetis, et al., Si-based GeSn lasers with wavelength coverage of 2-3 μm and operating temperatures up to 180 K, ACS Photonics 5, 827-833 (2017).

Y. Zhou, et al., Optically Pumped GeSn Lasers Operating at 270 K with Broad Waveguide Structures on Si, ACS Photonics 6, 1434-1441 (2019).

D. Stange, et al., GeSn/SiGeSn Heterostructure and Multi Quantum Well Lasers, ACS Photonics 5, 4628-4636 (2018).

J. Margetis, et al., All group-IV SiGeSn/GeSn/SiGeSn QW laser on Si operating up to 90 K, Appl. Phys. Left. 113, 221104 (2018).

Q. M. Thai, et al., GeSn heterostructure micro-disk laser operating at 230 K, Opt. Express 26, 32500-32508 (2018).

J. Chrétien, et al., GeSn Lasers Covering a Wide Wavelength Range Thanks to Uniaxial Tensile Strain, ACS Photonics 6, 2462-2469 (2019).

A. Elbaz, et al., Ultra-low threshold cw and pulsed lasing in tensile strained GeSn alloys, Nature Photon. 14, 375-382 (2020).

G. Sun, R. A. Soref, and H. H. Cheng, Design of an electrically pumped SiGeSn/GeSn/SiGeSn double-heterostructure mid-infrared laser, J. Appl. Phys. 108, 033107 (2010).

G. Sun, R. A. Soref, and H. H. Cheng, Design of a Si-based lattice-matched room-temperature GeSn/GeSiSn multi-quantum-well mid-infrared laser diode, Opt. Express 18, 19957-19965 (2010).

W. Dou, et al., Investigation of GeSn Strain Relaxation and Spontaneous Composition Gradient for Low-Defect and High-Sn Alloy Growth, Sci. Rep. 8, 5640 (2018).

G. Sun, H.H. Cheng, J. Menéndez, J.B. Khurgin, and R.A. Soref, Strain-free Ge/GeSiSn quantum cascade lasers based on L-valley intersubband transitions, Appl. Phys. Lett. 90, 251105 (2007).

H. Tran, et al., Systematic study of $Ge_{1-x}Sn_x$ absorption coefficient and refractive index for the device applications of Si-based optoelectronics, J. Appl. Phys 119, 103106 (2016).

Y. Zhou, et al., Systematic study of GeSn heterostructure-based light-emitting diodes towards mid-infrared applications, J. Appl. Phys. 120, 023102 (2016).

H. Tran, et al., Si-based GeSn photodetectors toward mid-infrared imaging applications, ACS Photonics 6, 2807 (2019).

J. Pankove, Temperature dependence of emission efficiency and lasing threshold in laser diodes, IEEE J. Quantum Electron. 4, 119-122 (1968).

I. Hayashi and M. B. Panish, GaAs—$Ga_xAl_{1-x}As$ Heterostructure Injection Lasers which Exhibit Low Thresholds at Room Temperature, J. Appl. Phys. 41, 150 (1970).

I. Hayashi, M. B. Panish, and F. K. Reinhart, GaAs—$Al_xGa_{1-x}As$ Double Heterostructure Injection Lasers, J. Appl. Phys. 42, 1929 (1971).

C. J. Nuese, M. Ettenberg, and G. H. Olsen, Room-temperature heterojunction laser diodes from vapor-grown $In_{1-x}Ga_xP$/GaAs structures, Appl. Phys. Lett. 25, 612 (1974).

* cited by examiner

SIGESN LASER DIODES AND METHOD OF FABRICATING SAME

CROSS-REFERENCE TO RELATED PATENT APPLICATION

This application claims priority to and the benefit of U.S. Provisional Patent Application Ser. No. 63/084,207, filed Sep. 28, 2020, which is incorporated herein in its entirety by reference.

STATEMENT AS TO RIGHTS UNDER FEDERALLY-SPONSORED RESEARCH

This invention was made with government support under grant numbers FA9550-18-1-0045 and FA9550-19-1-0341 awarded by the Air Force Office of Scientific Research. The government has certain rights in the invention.

FIELD OF THE INVENTION

The invention relates generally to semiconductors, and more particularly to SiGeSn laser diodes and methods of fabricating the same.

BACKGROUND OF THE INVENTION

The background description provided herein is for the purpose of generally presenting the context of the present invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions.

Silicon-based lasers have long been highly desirable owing to the possibility of monolithic integration of photonics with high-speed Si electronics and the aspiration of broadening the reach of Si technology by expanding its functionalities well beyond electronics. To overcome the intrinsic problem of bandgap indirectness in the group-IV semiconductors of Si, Ge, and SiGe alloys, a new group-IV material system (SiGeSn) has been successfully demonstrated. In particular, direct bandgap GeSn alloys have been investigated as a gain medium for lasers on Si substrates. While there remains significant challenges in the growth of SiGeSn materials, device-quality epilayers with a wide range of alloy compositions have been achieved, which have led to the demonstration of GeSn lasers: a significant breakthrough for the recent SiGeSn material research. Albeit the optically pumped GeSn lasers made impressive progress in recent years, the design of GeSn laser diodes for electrical injection has not been achieved and therefore is highly desirable.

Therefore, a heretofore unaddressed need exists in the art to address the aforementioned deficiencies and inadequacies.

SUMMARY OF THE INVENTION

One of the objectives of this invention is to disclose various designs of a semiconductor laser diode that comprises a p-i-n double heterostructure (e.g., a p-type doped SiGeSn top layer, an intrinsic GeSn active region, and an n-type doped SiGeSn or GeSn buffer layer) grown on a Ge buffer on a silicon or silicon-on-insulator substrate. By defining the top layer as a hole carrier injector, the semiconductor laser diode according to embodiments if the invention limits the hole carriers leaking through the top/active region interface, which has a type-II band alignment. The SiGeSn laser would benefit from the invented structure with a reduced carrier loss, leading to higher operation efficiency.

In one aspect, the invention relates to a laser diode comprising a double heterostructure (DHS) comprising a top layer, a buffer layer formed on a substrate, and an intrinsic active layer formed between the top layer and the buffer layer. The top layer and the buffer layer have opposite types of conductivity. The active layer has a bandgap smaller than that of the buffer layer or the top layer.

In one embodiment, the DHS comprises Ge, SiGe, GeSn, and/or SiGeSn materials.

In one embodiment, the laser diode further comprises first and second electrodes, wherein the first electrode is coupled to the top layer, the second electrode is coupled to the buffer layer or the substrate.

In one embodiment, the substrate is heavily doped when the second electrode is coupled to the substrate.

In one embodiment, the active layer comprises a direct bandgap GeSn bulk or quantum well (QW) structure.

In one embodiment, the QW structure comprises single or multiple QWs.

In one embodiment, the QW structure comprises one or more direct bandgap GeSn wells and/or one or more SiGeSn barriers.

In one embodiment, the active layer is a nominally intrinsic $Ge_aSn_b$ active layer having a thickness in a range of about 50-2000 nm, wherein a+b=1.

In one embodiment, each of the top layer and the buffer layer serves as a contact layer by a heavy doping level.

In one embodiment, the buffer layer is doped as an n-type.

In one embodiment, the buffer layer comprises one or more layers with different Sn compositions for achieving a strain relaxation.

In one embodiment, the buffer layer comprises a first buffer layer formed of a Ge material on the substrate, and a second buffer layer formed of a GeSn and/or SiGeSn material on the first buffer layer.

In one embodiment, the first buffer layer is a nominal strain-relaxed Ge buffer layer having a thickness less than about 2000 nm, with n-type doping of about $1 \times 10^{17}$ cm$^{-3}$.

In one embodiment, the second buffer layer is formed of a GeSn material and/or a SiGeSn material and has a thickness less than about 2000 nm, with t n-type doping of about $1 \times 10^{17}$ cm$^{-3}$.

In one embodiment, the top layer is doped as a p-type.

In one embodiment, the top layer is formed of a GeSn material and/or a SiGeSn material.

In one embodiment, the top layer comprises one or more layers including a first top layer formed on the active layer, and a second top layer formed on the first top layer and doped heavily relative to the first top layer.

In one embodiment, the first top layer is a $Si_xGe_ySn_z$ cap layer having a thickness less than about 2000 nm, with p-type doping of about $1 \times 10^{17}$ cm$^{-3}$, and the second top layer is a $Si_xGe_ySn_z$ Ohmic contact layer having a thickness less than about 2000 nm, with p-type doping of about $1 \times 10^{19}$ cm$^{-3}$, wherein x+y+z=1.

In one embodiment, when holes are injected from a top of the top layer, hole barriers in a valance band between the active layer and the buffer layer confines the holes in the active region to facilitate population inversion.

In one embodiment, when electrons are injected from a bottom of the buffer layer, electron barriers in Γ valley that is lower band than L valley in a conduction band between the active layer and the top layer prevents leakage of electrons, thereby confining the electrons in the active region.

In one embodiment, the DHS has a p-i-n structure configured to minimize hole leakage and enhance carrier confinement.

In one embodiment, the top layer is designed as a type-I band alignment to the active region, and the DHS has a p-i-n or n-i-p structure.

In one embodiment, the type-I band alignment is achieved by designing the top layer lattice match or compressively strained on the active region.

In one embodiment, the top layer is designed as a type-II band alignment to the active region, the DHS has a p-i-n structure.

In another aspect, the invention relates to a method of forming a laser diode, comprising growing a laser diode structure via a chemical vapor deposition reactor using precursors of $SiH_4$ (or $Si_3H_8$), $GeH_4$ (or $Ge_2H_6$), and/or $SnCl_4$ (or $SnD_4$) on a substrate. The laser diode structure comprises a double heterostructure (DHS) comprising a buffer layer grown on the substrate, an intrinsic active layer frown on the buffer layer, and a top layer grown in the buffer layer, wherein the top layer and the buffer layer are doped to have opposite types of conductivity, and wherein the active layer has a bandgap smaller than that of the buffer layer or the top layer.

In one embodiment, the buffer layer comprises a nominal strain-relaxed Ge buffer layer grown on the substrate, having a thickness less than about 2000 nm, with n-type doping of about $1\times10^{17}$ $cm^{-3}$, and a GeSn/SiGeSn buffer layer grown on the nominal strain-relaxed Ge buffer layer, having a thickness less than about 2000 nm, with n-type doping of about $1\times10^{17}$ $cm^{-3}$.

In one embodiment, the active layer is a nominally intrinsic $Ge_aSn_b$ active layer grown on the GeSn buffer layer, having a thickness in a range of about 50-2000 nm, where a+b=1.

In one embodiment, the top layer comprises a first $Si_xGe_ySn_z$ cap layer grown on the nominally intrinsic $Ge_aSn_b$ active layer, having a thickness less than about 2000 nm, with p-type doping of about $1\times10^{17}$ $cm^{-3}$, and a second $Si_xGe_ySn_z$ Ohmic contact layer grown on the first $Si_xGe_ySn_z$ cap layer, having a thickness less than about 2000 nm, with p-type doping of about $1\times10^{19}$ $cm^{-3}$, wherein x+y+z=1.

In one embodiment, all doping growth is performed in-situ by introducing corresponding doping gases.

In one embodiment, the method further comprises forming an electrode on each of the top layer, the buffer layer and the substrate.

These and other aspects of the present invention will become apparent from the following description of the preferred embodiments, taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. The same reference numbers may be used throughout the drawings to refer to the same or like elements in the embodiments.

As shown in FIG. 2, the top layer and active region are removed completely as an example.

DETAILED DESCRIPTION OF THE INVENTION

Figure 1:
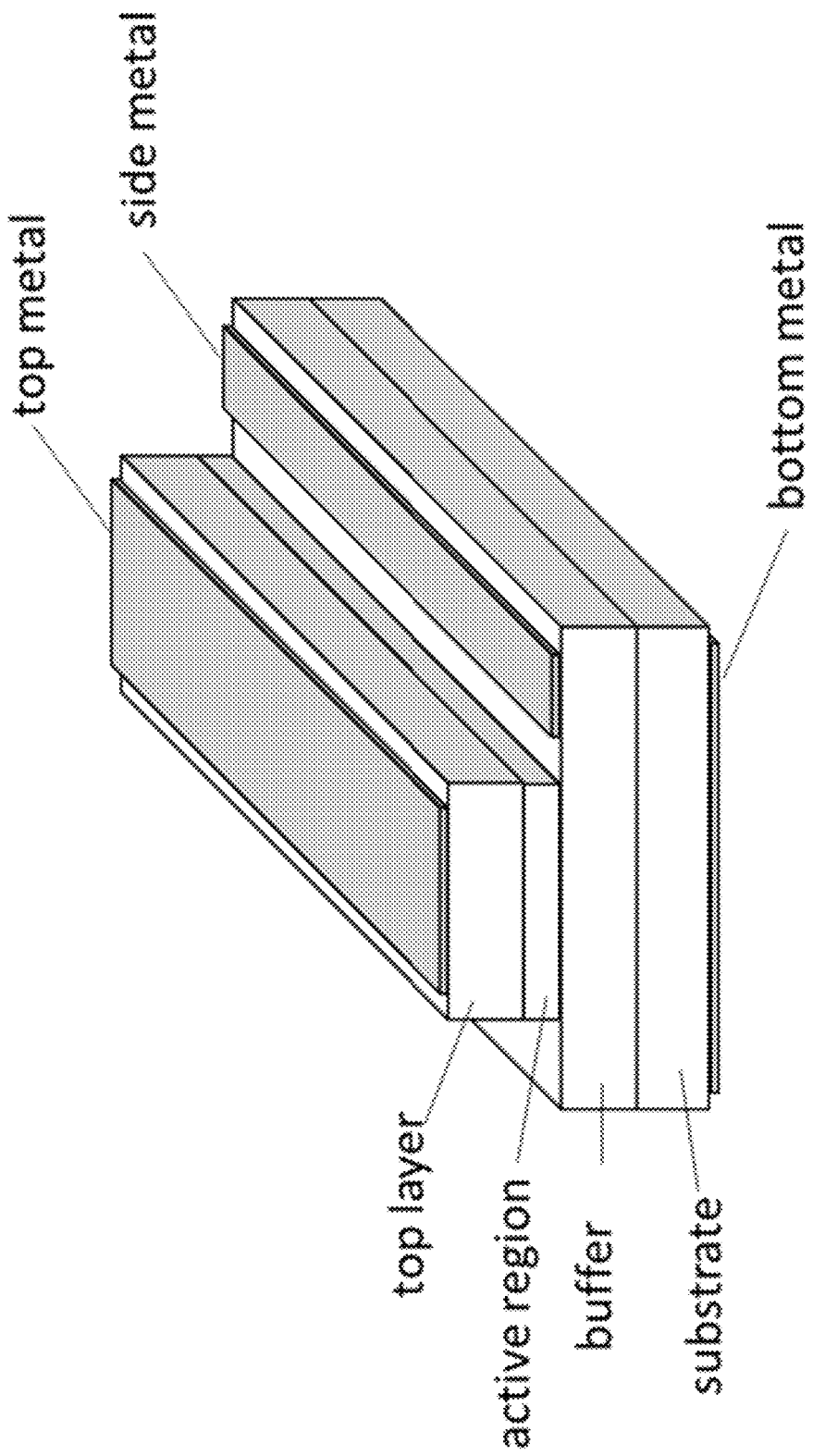
FIG. 1 shows schematically a perspective view of a laser diode structure according to embodiments of the invention.

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this invention will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the invention has been specifically disclosed by preferred embodiments and optional features, modification and variation of the concepts herein disclosed may be resorted to by those skilled in the art, and that such modifications and variations are considered to be within the scope of this invention as defined by the appended claims.

Whenever a range is given in the specification, for example, a temperature range, a time range, or a composition or concentration range, all intermediate ranges and subranges, as well as all individual values included in the ranges given are intended to be included in the invention. It will be understood that any subranges or individual values in a range or subrange that are included in the description herein can be excluded from the claims herein.

It will be understood that, as used in the description herein and throughout the claims that follow, the meaning of "a", "an", and "the" includes plural reference unless the context clearly dictates otherwise. Thus, for example, reference to "a cell" includes a plurality of such cells and equivalents thereof known to those skilled in the art. As well, the terms "a" (or "an"), "one or more" and "at least one" can be used interchangeably herein. It is also to be noted that the terms "comprising", "including", and "having" can be used interchangeably.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising", or "includes" and/or "including", or "has" and/or "having", or "carry" and/or "carrying", or "contain" and/or "containing", or "involve" and/or "involving", "characterized by", and the like are to be open-ended, i.e., to mean including but not limited to. When used in this disclosure, they specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

As used in the disclosure, "around", "about", "approximately" or "substantially" shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated.

As used in the disclosure, the phrase "at least one of A, B, and C" should be construed to mean a logical (A or B or C), using a non-exclusive logical OR. As used herein, the term "and/or" includes any and all combinations of one or more of the associated listed items.

Embodiments of the invention are illustrated in detail hereinafter with reference to accompanying drawings. The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the invention.

Double heterostructure (DHS) has been successfully utilized in laser diode structures. The structures have two layers of wider bandgap semiconductors with opposite conductivity types sandwiching one layer of an intrinsic narrower bandgap semiconductor. The injected carriers are accumulated within the DHS structure with a higher carrier density. Such high carrier density and Fermi level alignment to the wider bandgap layers facilitate the population inversion in the narrower bandgap layer. As a result, low threshold room temperature operation was demonstrated in group III-V material based lasers. Therefore, using DHS is a viable approach for the electrically injected SiGeSn laser diode.

In some embodiments, for designing SiGeSn DHS laser diode, SiGeSn or GeSn with lower Sn composition can be the viable selection for the wider bandgap layers. The narrower bandgap layer, GeSn with higher Sn composition (>8%) can be used as the active region. In order to have a wide bandgap in the top layer, SiGeSn with lower Sn composition is selected, which lead to a smaller lattice constant than that of the GeSn active region. As a result, the top layer is tensile strained on the top of a relaxed GeSn active region. The tensile strained top layer forms a type-II alignment with the active region. Both the conduction and valance bands in the top layer have higher energy than the bands in the active region. This alignment causes the hole leakage, especially when the electrical field has the direction towards the top layer. In such condition, the hole flows through the active region and enter the top layer, causing the carrier leakage, i.e., the reduction of hole concentration in the active region.

Figure 2:
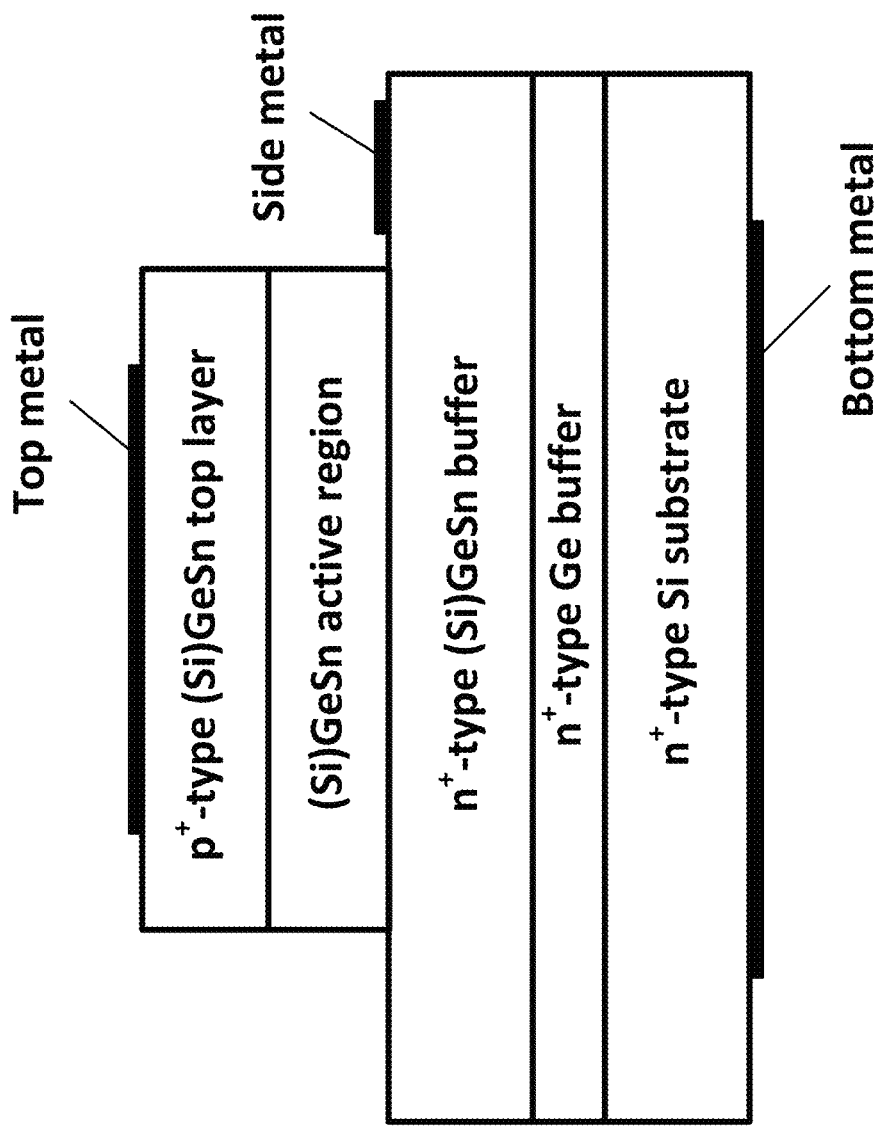
FIG. 2 shows schematically a cross-sectional view of an SiGeSn laser diode structure fabricated into a ridge waveguide laser diode including a top layer, an active region, buffer layers, and a substrate, ridge waveguide, and electrodes, according to embodiments of the invention. The term "ridge waveguide" used herein refers to a "stripe shape" structure that is used to confine the optical mode. In certain embodiments, the stripe shape structure is formed by etching one or multiple layers from the top surface (either partially or completely).

FIGS. 1-2 show schematically a SiGeSn DHS laser diode according to embodiments of the invention. In this exemplary embodiments, the DHS structure includes (i) a top layer, (ii) intrinsic active region, and (iii) a buffer layer (single or multiple layers). The top and buffer layer serve as the contact layer by the heavy doping level. The metal layers serve as electrodes. Ge, SiGe, GeSn, and SiGeSn, can be used for the material of the DHS, which the band gap of the active region is smaller than that of the buffer and top layers. The buffer layer may have multiple layers with different Si and Sn composition used to achieve the strain relaxation. For example, as shown in FIG. 2, the buffer layer includes an n$^+$-type Ge buffer layer and an n$^+$-type (Si)GeSn buffer layer. The active region is intrinsic and includes a direct band gap GeSn bulk or a quantum well (QW) structure. In certain embodiments, the QW structure is made of single or multiple QW including direct band gap GeSn well(s) and SiGeSn barrier(s). The top layer includes a SiGeSn material.

Figure 3:
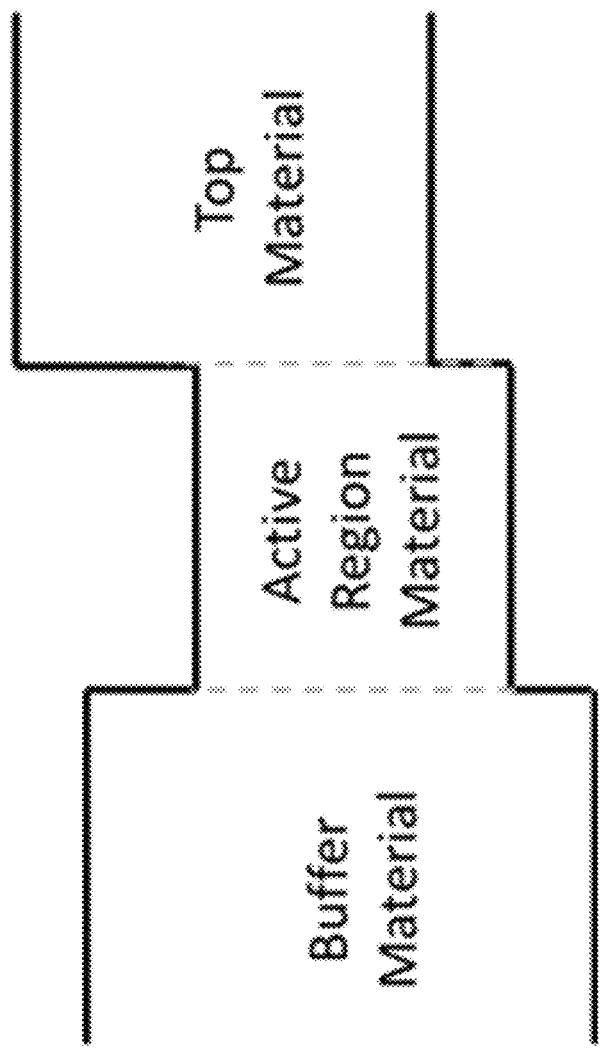
FIG. 3 shows schematically an energy band diagram for a type-II band alignment diode, according to embodiments of the invention.

For an electrically injected laser, in order to address this poor hole-confinement issue caused by the type II alignment, the SiGeSn top layer was intentionally doped as p-type. One embodiment of the type-II band alignment in the DHS is shown in FIG. 3. As the holes are injected from the top of the SiGeSn top layer, they are forced to flow to the GeSn active region. Since there are hole barriers in the valance band between the GeSn active region/layer and the GeSn buffer layer, the holes could be confined in the active region to facilitate the population inversion. While the electrons are injected from the bottom of the GeSn buffer with the n-type contact, the electron barrier in Γ valley (lower band than L valley) in the conduction band between the GeSn active layer and the SiGeSn top layer prevents the leakage of electrons and confines them in the active region. Accordingly, this p-i-n device structure design according to the embodiments of the invention, rather than the n-i-p structure which may utilize the p-type unintentionally background doping of the GeSn buffer, effectively minimizes the hole leakage and enhances the carrier confinement.

The early design of GeSn double-heterostructure in previous literature overlooked the factor of the type-II alignment due to the tensile strain, which could limit the performance significantly. In this invention, the elimination is resolved by forming the p-i-n doping specifically, instead of the n-i-p doping in the literature.

Alternatively, when the top layer is designed as a type-I alignment to the active region, the device can be a p-i-n or n-i-p structure. The type-I alignment can be achieved by designing the top layer lattice match or compressively strained on the active region.

The first electrically injected GeSn laser diode was demonstrated using the p-i-n DHS structure. The laser operates from 10 to 100 K under the pulse condition (1 kHz repetition rate and 700 ns pulse width). The device has a threshold of 598 A/cm$^2$ at 10 K and the emission peak wavelength of 2,266 nm. Detailed results are summarized in EXAMPLE below.

The invention also discloses the method of realizing the electrically injected GeSn lasers that are monolithically grown on Si, whose gain medium is all group-IV based direct band gap material. Albeit the optically pumped GeSn lasers made impressive progress in recent years, lasing through electrical injection has not been achieved, and therefore is highly desirable. The special device structure according to the invention is designed to ensure the effective carrier and optical confinement.

Among other things, this invention represents a significant milestone towards realizing all group-IV GeSn lasers to enable full Si-photonics integration by adding the last missing component for the whole suite of functional devices. The field of developing GeSn lasers has been highly competitive. Since the optically pumped GeSn laser was demonstrated operating up to 270 K, there is already significant progress in the community such as further increasing operating temperature and achieving CW operation at a low temperature. Therefore, the GeSn based laser has high potential towards room-temperature and CW operation, which is desired for commercial applications.

More specifically, the invention relates to semiconductor laser diodes and methods of fabricating the same.

In one aspect of the invention, the laser diode comprises a double heterostructure (DHS) comprising a top layer, a buffer layer formed on a substrate, and an intrinsic active layer formed between the top layer and the buffer layer, as shown in FIGS. 1-2. In some embodiment, the DHS comprises Ge, SiGe, GeSn, and/or SiGeSn materials.

In some embodiments, the laser diode also comprises first and second electrodes, wherein the first electrode is coupled to the top layer, the second electrode is coupled to the buffer layer or the substrate. In some embodiments, the substrate is heavily doped when the second electrode is coupled to the substrate.

The active layer has a bandgap smaller than that of the buffer layer or the top layer.

In some embodiments, the active layer comprises a direct bandgap GeSn bulk or quantum well (QW) structure.

In some embodiments, the QW structure comprises single or multiple QWs. In some embodiments, the QW structure comprises one or more direct bandgap GeSn wells and/or one or more SiGeSn barriers.

In some embodiments, the active layer is a nominally intrinsic $Ge_aSn_b$ active layer having a thickness in a range of about 50-2000 nm, where a+b=1. In one embodiment shown in FIG. 4A, the active layer is a nominally intrinsic $Ge_{0.89}Sn_{0.11}$ active layer having the thickness of about 1000 nm, with a Sn composition in the active region greater than 8%.

In some embodiments, each of the top layer and the buffer layer serves as a contact layer by a heavy doping level. The top layer and the buffer layer have opposite types of conductivity. In some embodiments, the buffer layer is doped as an n-type. In some embodiments, the top layer is doped as a p-type.

In some embodiments, the buffer layer comprises one or more layers with different Sn compositions for achieving a strain relaxation.

In some embodiments, the buffer layer comprises a first buffer layer formed of a Ge material on the substrate, and a second buffer layer formed of a GeSn and/or SiGeSn material on the first buffer layer.

In some embodiments, the first buffer layer is a nominal strain-relaxed Ge buffer layer having a thickness less than about 2000 nm, with n-type doping of about $1\times10^{17}$ $cm^{-3}$, and the second buffer layer is formed of a GeSn material and/or a SiGeSn material and has a thickness less than about 2000 nm, with n-type doping of about $1\times10^{17}$ $cm^{-3}$. In one exemplary embodiment shown in FIG. 4A, the first buffer layer is a nominal strain-relaxed Ge buffer layer having a thickness of about 500 nm, with n-type doping of about $1\times10^{19}$ $cm^{-3}$, and the second buffer layer is a GeSn buffer layer having a thickness of about 700 nm, with the nominal Sn composition increase from about 8% to about 11% by weight along a growth direction from the first buffer layer to the active layer, and n-type doping of about $1\times10^{19}$ $cm^{-3}$.

In some embodiments, the top layer is formed of a GeSn material and/or a SiGeSn material.

In some embodiments, the top layer comprises one or more layers including a first top layer formed on the active layer, and a second top layer formed on the first top layer and doped heavily relative to the first top layer.

In some embodiments, the first top layer is a $Si_xGe_ySn_z$ cap layer having a thickness less than about 2000 nm, with p-type doping of about $1\times10^{17}$ $cm^{-3}$, and the second top layer is a $Si_xGe_ySn_z$ Ohmic contact layer having a thickness less than about 2000 nm, with p-type doping of about $1\times10^{19}$ $cm^{-3}$, wherein x+y+z=1. Si, Ge and Sn can be in any composition range as long as a composition combination forms a band gap greater than the band gap in the active region. In one exemplary embodiment shown in FIG. 4A, the first top layer is a $Si_{0.03}Ge_{0.89}Sn_{0.08}$ cap layer having a thickness of about 170 nm, with p-type doping of about $1\times10^{18}$ $cm^{-3}$, and the second top layer is a $Si_{0.03}Ge_{0.89}Sn_{0.08}$ Ohmic contact layer having a thickness of 70 nm, with p-type doping of about $1\times10^{19}$ $cm^{-3}$.

In some embodiments, when holes are injected from a top of the top layer, hole barriers in a valance band between the active layer and the buffer layer confines the holes in the active region to facilitate population inversion.

In some embodiments, when electrons are injected from a bottom of the buffer layer, electron barriers in Γ valley that is lower band than L valley in a conduction band between the active layer and the top layer prevents leakage of electrons, thereby confining the electrons in the active region.

In some embodiments, the DHS has a p-i-n structure configured to minimize hole leakage and enhance carrier confinement.

In some embodiments, the top layer is designed as a type-I band alignment to the active region, and the DHS has a p-i-n or n-i-p structure.

In some embodiments, the type-I band alignment is achieved by designing the top layer lattice match or compressively strained on the active region.

In some embodiments, the top layer is designed as a type-II band alignment to the active region, the DHS has a p-i-n structure.

In another aspect of the invention, the method of forming a laser diode comprises growing a laser diode structure via a chemical vapor deposition reactor using precursors of $SiH_4$ (or $Si_3H_8$), $GeH_4$ (or $Ge_2H_6$), and/or $SnCl_4$ (or $SnD_4$) on a substrate.

The laser diode structure comprises a double heterostructure (DHS) comprising a buffer layer grown on the substrate, an intrinsic active layer frown on the buffer layer, and a top layer grown in the buffer layer, wherein the top layer and the buffer layer are doped to have opposite types of conductivity, and wherein the active layer has a bandgap smaller than that of the buffer layer or the top layer.

In some embodiments, the buffer layer comprises a nominal strain-relaxed Ge buffer layer grown on the substrate, having a thickness less than about 2000 nm, with n-type doping of about $1\times10^{17}$ $cm^{-3}$, and a GeSn/SiGeSn buffer layer grown on the nominal strain-relaxed Ge buffer layer, having a thickness less than about 2000 nm, with n-type doping of about $1\times10^{17}$ $cm^{-3}$.

In some embodiments, the active layer is a nominally intrinsic $Ge_aSn_b$ active layer grown on the GeSn buffer layer, having a thickness in a range of about 50-2000 nm, wherein a+b=1.

In some embodiments, the top layer comprises a first $Si_xGe_ySn_z$ cap layer grown on the nominally intrinsic $Ge_aSn_b$ active layer, having a thickness less than about 2000 nm, with p-type doping of about $1\times10^{17}$ $cm^{-3}$, and a second $Si_xGe_ySn_z$ Ohmic contact layer grown on the first $Si_xGe_ySn_z$ cap layer, having a thickness less than 2000 nm, with p-type doping of about $1\times10^{19}$ $cm^{-3}$, wherein x+y+z=1.

In some embodiments, all doping growth is performed in-situ by introducing corresponding doping gases.

In some embodiments, the method further comprises forming an electrode on each of the top layer, the buffer layer and the substrate.

These and other aspects of the present invention are further described below. Without intent to limit the scope of the invention, exemplary instruments, apparatus, methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Example

Electrically Injected GeSn Lasers on Si Operating Up to 100 K

Monolithic lasers on Si have long been anticipated as an enabler of full photonic integration, and significant progress in GeSn material development shows promise for such laser devices. While there are many reports focused on optically pumped lasers, in this exemplary example, the electrically injected GeSn lasers on Si were demonstrated. The GeSn/SiGeSn heterostructure diodes were grown on a Si substrate in a ridge waveguide laser device and tested under pulsed conditions, giving consideration to the structure design to enhance the carrier and optical confinement. The peak linewidth of 0.13 nm (0.06 meV) and injection current curves indicated lasing, which was observed up to 100 K with emission peaks at 2300 nm. The threshold of 598 A/cm$^2$ was recorded at 10 K. The peak power and EQE were measured as 2.7 mW/facet and 0.3%, respectively. The results show major advances for group-IV based lasers, which could serve as the promising route for laser integration on Si.

Introduction

Research advance in GeSn semiconductors has opened a new avenue for the development of Si-based optoelectronic devices. With Sn content over 8%, GeSn turns into a direct bandgap material, which is essential for efficient light emission. Furthermore, the GeSn epitaxy is monolithic on Si and fully compatible with complementary metal-oxide-semiconductor (CMOS). The broad wavelength coverage also makes it versatile for mid-infrared applications, such as bio/chemical sensing, spectroscopy, and pyrometry. All these advantages make the GeSn material a promising candidate for the integrated light source on the Si platform that enables the system to be more compact, low-cost, efficient, and reliable.

In the last few years, there was considerable progress in the development of optically pumped GeSn lasers. The first GeSn laser was presented with a 12.6% Sn composition operating at temperatures up to 90 K. Later, higher Sn incorporation was reported to be beneficial on elevating the lasing temperature. Further attempt on 20% Sn incorporation resulted in near room temperature lasing operation. The SiGeSn/GeSn heterostructure and multiple-quantum-well lasers were achieved with reduced threshold as well as elevated operating temperatures. Efforts on strain engineering of the GeSn lasers showed great improvements in device performance as an alternative route to incorporating more Sn. The laser operating temperature as high as 273 K with 16% Sn composition was shown. A continuous-wave optically pumped laser was reported with Sn composition as low as 5.4% in a tensile strained disk structure. Thus far, all GeSn lasers were reported using optically pumping and how to achieve electrically injected lasers as predicted earlier remains elusive.

In the exemplary example, the first demonstration of electrically injected GeSn diode lasers were presented. The GeSn/SiGeSn double-heterostructure was grown which ensures the carrier-and-optical confinement. To address the hole leakage due to a type-II band alignment between the GeSn active layer and the top SiGeSn barrier, the p-type top SiGeSn layer was designed to facilitate the hole injection. The ridge waveguide GeSn lasers were fabricated and pulsed lasing was observed up to 100 K. The threshold was measured at 598 A/cm$^2$ at 10 K. The characteristic temperature $T_0$ was extracted from 76 to 99 K at the temperature range of 10 to 77 K for different devices.

Experiment

The laser diode structure was grown via an industry-standard chemical vapor deposition reactor using commercially available precursors on a 200-mm (100) Si substrate. Five epitaxial layers were grown from bottom to top: i) a nominal 500-nm-thick strain-relaxed Ge buffer layer, with n-type doping of $1\times10^{19}$ cm$^{-3}$; ii) a 700-nm-thick GeSn buffer layer using the spontaneous relaxation enhanced growth method, with nominal Sn composition from 8% (bottom) to 11% (top), and n-type doping of $1\times10^{19}$ cm$^{-3}$; iii) a nominally intrinsic 1000-nm-thick Ge$_{0.89}$Sn$_{0.11}$ active layer; iv) a 170-nm Si$_{0.03}$Ge$_{0.89}$Sn$_{0.08}$ cap layer with p-type doping of $1\times10^{18}$ cm$^{-3}$; and v) a 70-nm Si$_{0.03}$Ge$_{0.89}$Sn$_{0.08}$ Ohmic contact layer with p-type doping of $1\times10^{19}$ cm$^{-3}$. All doping growth was done in-situ by introducing corresponding doping gases. The cross-sectional schematic of the laser device is shown in FIG. 4A. The compositions of Sn and the layer thickness were measured by X-ray diffraction and transmission electron microscopy techniques.

After the growth, the sample was fabricated into ridge waveguide laser structures and then cleaved into individual devices with the cavity lengths of 0.3, 0.5, 0.8, and 1.7 mm. The 80-μm-wide ridges were formed by wet etching. The etching depth was controlled at 1.4 μm to expose the GeSn buffer layer for metal contacts. Electron beam evaporated Cr and Au were deposited as both p and n electrodes through a lift-off process with the thickness of 10 and 350 nm, respectively. The Si substrate was lapped down to 140 μm thick, followed by cleaving to form the Fabry-Perot cavity. Finally, the devices were wire-bonded to a Si chip carrier and mounted in a cryostat for low-temperature measurements.

The current-voltage (IV) measurement was performed using a direct current source measurement unit. For the pulsed measurement, a pulsed high compliance voltage source was used to drive the laser and the current was monitored by a calibrated magnetically coupled current meter. The repetition rate of 1 kHz and the pulse width of 700 ns were used for the spectra and light output vs injection current (LI) measurements. The electroluminescence and photoluminescence (PL) emission signal was collected and analyzed through a monochromator (10 nm resolution) and liquid-nitrogen-cooled-InSb detector (response range 1-5.5 μm). The high-resolution spectra were obtained by using a Fourier-transform infrared spectroscopy (FTIR) instrument equipped with the InSb detector. Step-scan mode was used with a 0.25 cm$^{-1}$ resolution for the measurement.

Results

Figure 4B:
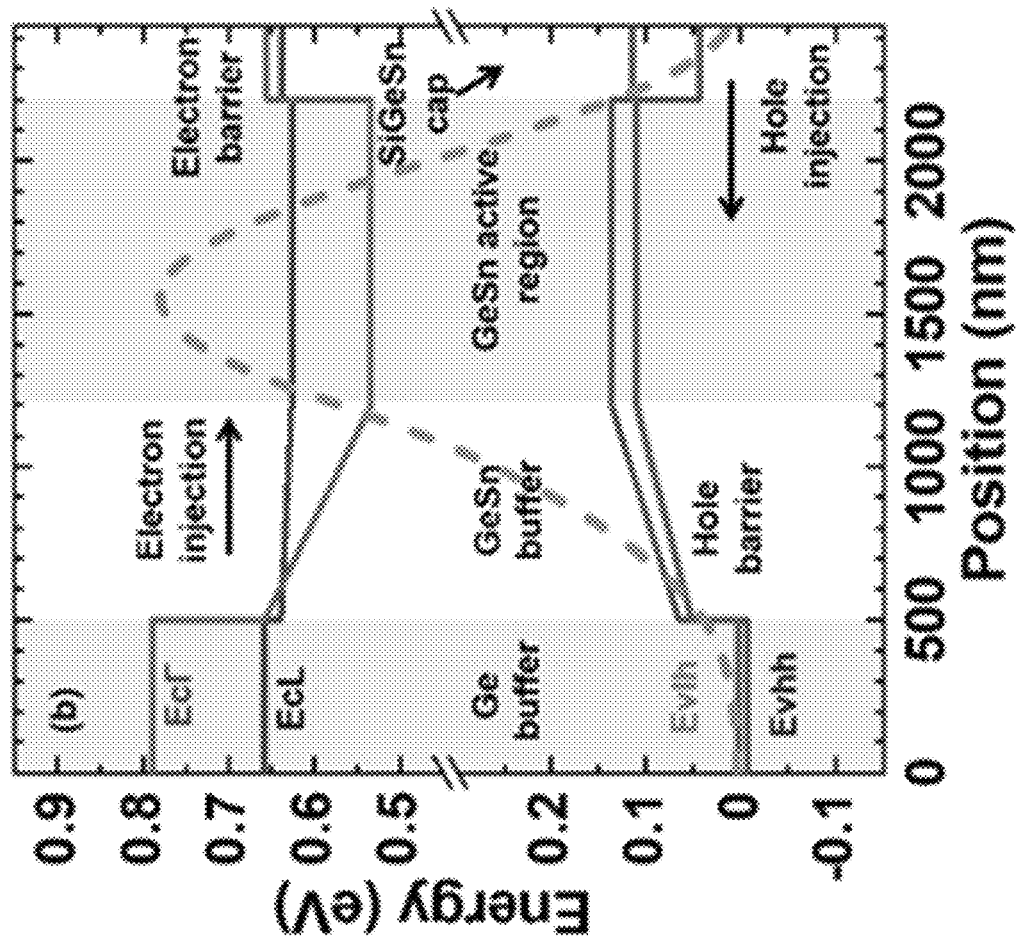
FIG. 4B shows calculations of band structure and profile of fundamental TE mode for the laser diode device shown in FIG. 4A. Band structure shows type II alignment between GeSn active and SiGeSn cap layers at LH band. Mode profile shows 75% of the optical field overlapped with the GeSn active region.
Figure 4A:
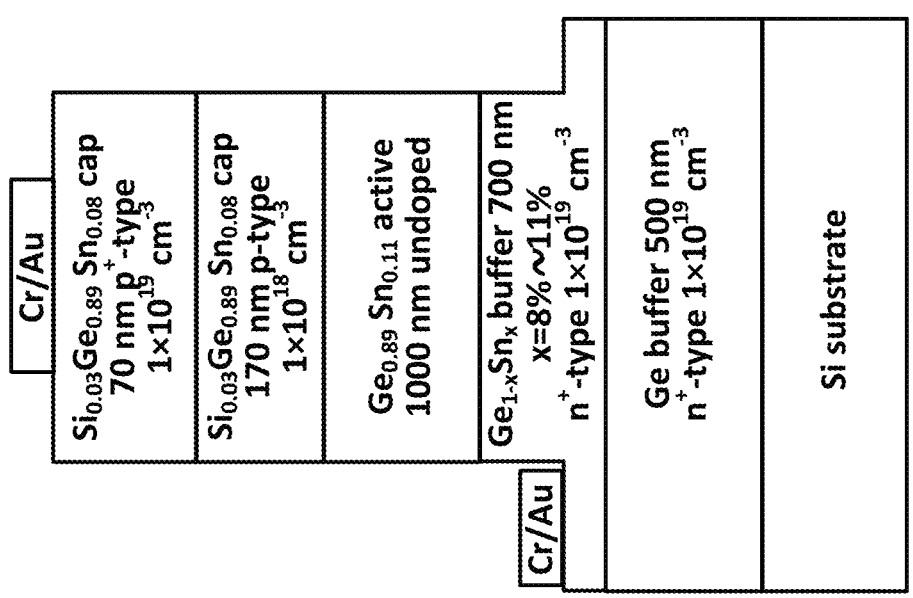
FIG. 4A shows schematically a cross-sectional view of a laser diode device according to embodiments of the invention.

The device band edge diagram at 300 K was calculated and plotted in FIG. 4B. Four sub-bands including indirect L ($E_{cL}$) and direct Γ ($E_{cΓ}$) valleys in the conduction band (CB) and heavy hole ($E_{vhh}$) and light hole ($E_{vlh}$) in the valence band (VB) were considered. The following features are obtained from FIG. 4B: i) Ge$_{0.89}$Sn$_{0.11}$ active layer has a direct bandgap with the energy difference of 92 meV between L and Γ valleys. The high degree of relaxation in this layer results in the small difference between heavy hole (HH) and light hole (LH) band; ii) In the CB, both Γ and L valleys feature type-I alignment due to the wider bandgap energies of the Si$_{0.03}$Ge$_{0.89}$Sn$_{0.08}$ cap and GeSn buffer. Note that the Sn composition increases in the GeSn buffer (8%~11%) along the growth direction, leading to the decrease of both Γ and L valleys in energy with the Γ more rapidly than the L valley; iii) In the VB, the HH band features type-I band alignment. The LH exhibits the type-II band alignment at the cap/active layer interface, due to the tensile strain within the $Si_{0.03}Ge_{0.89}Sn_{0.08}$ cap.

The fundamental TE mode was plotted (dashed curve) to show the optical field distribution. The refractive index for each layer was taken from our previous study. The optical confinement factor (optical field confined in $Ge_{0.89}Sn_{0.11}$ active region) was calculated as 75% using the wavelength at 2.3 μm.

Figure 5:
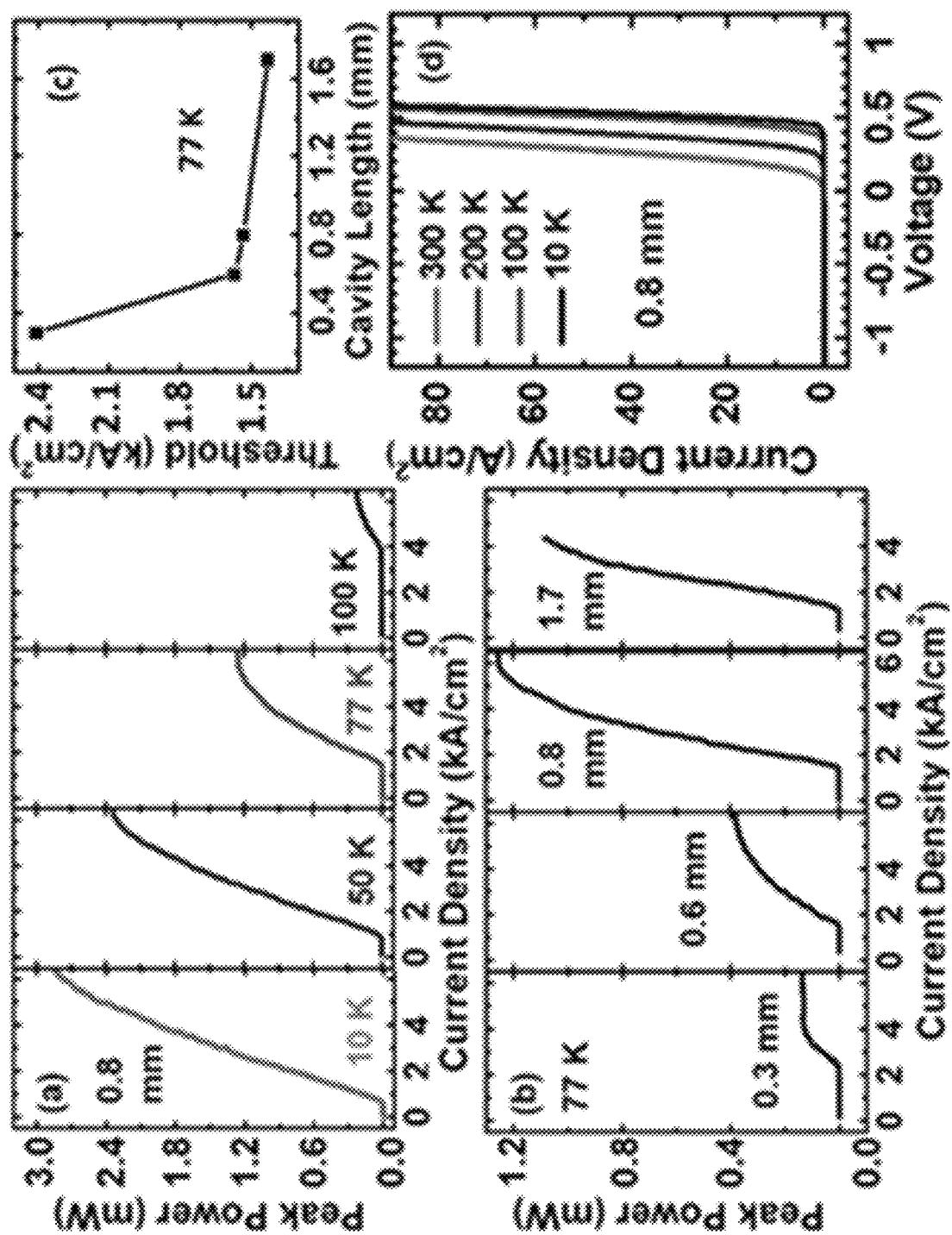
FIG. 5 shows characterization of a laser diode device according to embodiments of the invention. Panel (a): LI curves of the 0.8 mm cavity length device from 10 to 100 K; Panel (b): LI curves at 77 K for four devices with different cavity lengths; Panel (c): Threshold of each device at 77 K; and Panel (d): Temperature-dependent IV of the 0.8 mm cavity length device.

The typical pulsed LI curves from the 0.8-mm cavity length device were plotted in panel (a) of FIG. 5 at temperatures from 10 to 100 K (maximum lasing temperature). The threshold current densities are measured as 0.74 and 3.9 $kA/cm^2$ at 10 and 100 K, respectively. At 10 K, the emission shows a saturation feature at 7.5 $kA/cm^2$. The maximum peak power was measured as 2.7 mW/facet.

The LI characteristics of devices with different cavity lengths were studied, as shown in panel (b) of FIG. 5 at 77 K. The threshold current densities were measured as 2.4, 1.6, 1.5, and 1.4 $kA/cm^2$ for devices with cavity lengths of 0.3, 0.6, 0.8, and 1.7 mm, respectively, as shown in panel (c) of FIG. 5. As cavity length (L) increases, the decreased lasing threshold is mainly due to the reduced mirror loss ($\propto 1/L$). The 1.7-mm device has the lowest threshold among four devices, with the value of 598 $A/cm^2$ at 10 K. Moreover, the saturated emission intensity increases as L increases, except for the 1.7 mm device (no higher current could be applied due to device damage).

The typical IV characteristics of the 0.8-mm cavity length device were measured at various temperatures as plotted in panel (d) of FIG. 5. The series resistance is extracted as 1.2Ω at 10 K. The IV characteristics are consistent with our previous GeSn diode studies, where the detailed IV analysis was reported. Under the pulsed current operation, low duty cycle and short pulse width were chosen to minimize the joule heating.

Figure 6:
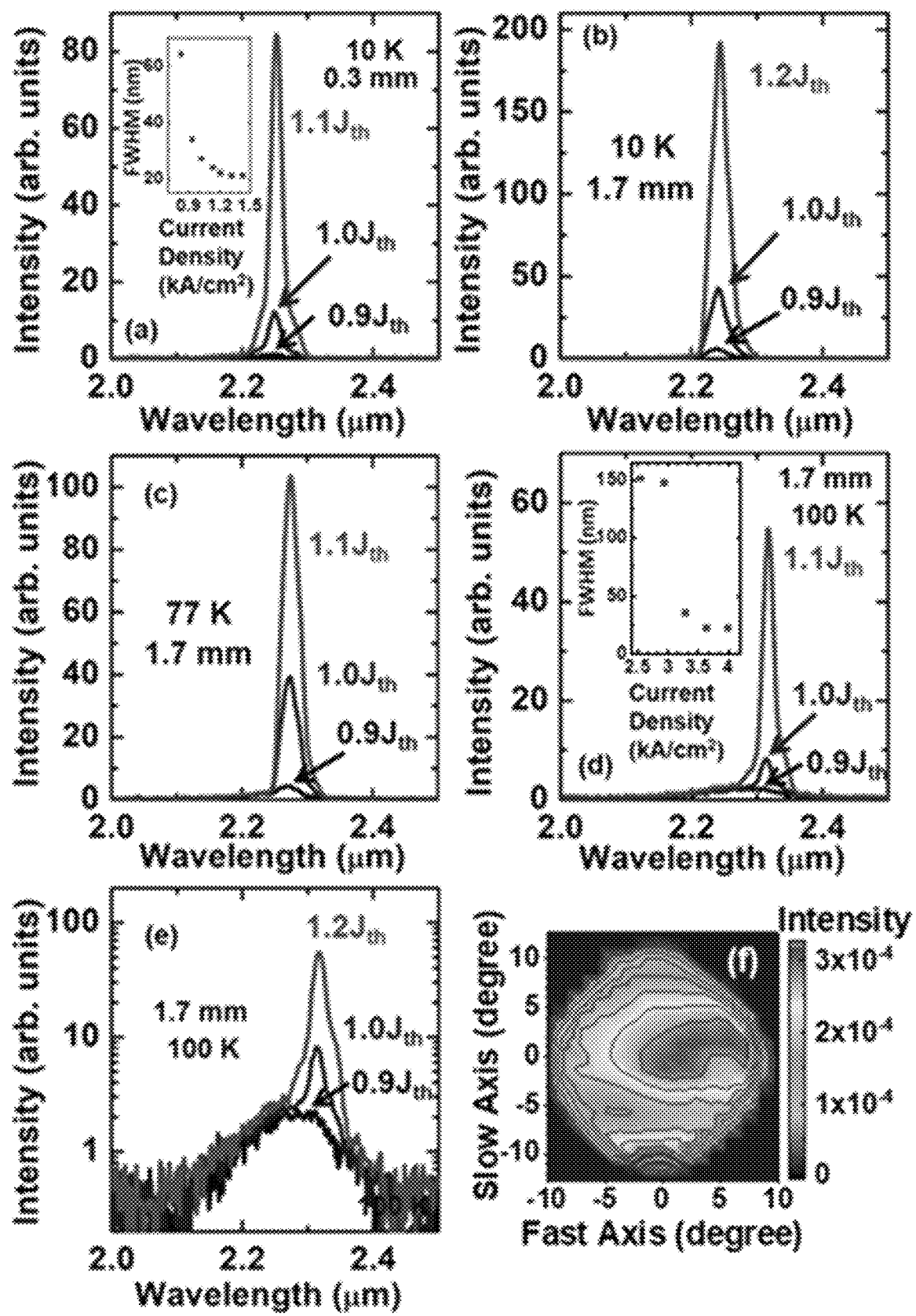
FIG. 6 shows emission spectra at various current injection levels of a laser diode device according to embodiments of the invention. Panel (a): 0.3 mm device at 10 K. Inset: extracted FWHM vs current density (spectral resolution of 10 nm); Panels (b), (c), and (d): 1.7 mm device at 10 K, 77 K, and 100 K. Inset in panel (d): extracted FWHM vs current density; Panel (e): log-scale plot of spectra in panel (d); and Panel (f): far field pattern from 1.7 mm device at 77 K.

The emission spectra below and above threshold were investigated. Panel (a) of FIG. 6 shows the spectra of the 0.3-mm cavity length device under various current injection levels at 10 K. Below the threshold, the peak full-width half max (FWHM) was 64 nm, while above the threshold the FWHM became about 20 nm, as shown in inset of panel (a) of FIG. 6. Note that the relative broad peak linewidth of 20 nm is due to the spectral resolution of 10 nm. At 10 K, the lasing emission peak was observed at 2250 nm.

Panels (b)-(d) of FIG. 6 show the emission spectra of the 1.7-mm cavity length device at 10, 77, and 100 K, respectively. At each temperature, as the injection current density increases from below to above the threshold, the significantly increased peak intensity and reduced FWHM were observed, both being the evidence of the lasing characteristic. At 10 K, the measured peak position is the same as for the 0.3-mm device, i.e., at 2250 nm. At 100 K, the lasing peak redshifts to 2300 nm as expected due to the narrowed bandgap. The log-scale plot of panel (d) of FIG. 6 is shown in panel (e). Above the threshold, the stimulated emission peak stands out from the broad spontaneous emission.

The far-field pattern was measured at the cross-section plane 4 cm away from the laser facet. Two major peaks were observed, indicating multi-mode operation, as shown in panel (f) of FIG. 6. The FWHMs of the major peaks at the center are estimated around 12 and 16 degrees along the fast and slow axis, respectively.

To further study the lasing characteristic, high-resolution spectra were measured using a FTIR. FIG. 4 shows the spectra of the 0.8-mm cavity length device at 77 K under various current injections. Above the threshold, the multi-mode lasing characteristic was clearly observed. The minimum FWHM of the individual peak is measured as 0.13 nm (or 0.06 meV). The dramatically reduced peak linewidth under higher injection is one of the lasing characteristics. At above 1.42×threshold, the peak at 2307 nm dominates the lasing spectrum.

Discussion

In comparison with obtaining optically pumped lasers, there are special considerations for both carrier confinement and optical confinement in this work for the device structure design. In considering the carrier confinement in these laser devices, the result of the band structure calculation shown in FIG. 4B reveals that a type-II band alignment between the GeSn active and SiGeSn cap layers in LH at VB. The type-II alignment is originated from the tensile strain of the SiGeSn cap lifting the LH band above that in the GeSn active layer. As a result, the hole leakage at the top surface could lead to an increase in the lasing threshold. Therefore, this design is not ideal for optically pumped devices. However, for electrically injected devices, in order to address this poor hole-confinement issue, the top SiGeSn layer was intentionally doped as p-type in this work. As the holes are injected from the top SiGeSn cap layer, they are forced to flow to the GeSn active region. Since there are hole barriers in both HH and LH bands at VB between GeSn active and GeSn buffer layers, the holes could be confined in the active region to facilitate the population inversion. While the electrons are injected from the bottom GeSn buffer with the n-type contact, the electron barrier in Γ valley (lower band than L valley) in CB between the GeSn active and the top SiGeSn cap prevent the leakage of electrons and confine them in the active region. This p-i-n device structure design, rather than the n-i-p structure which may utilize the p-type unintentionally background doping of the GeSn buffer, effectively minimizes the hole leakage and enhances the carrier confinement. Similar asymmetric confinement structure design can be found in early III-V double-heterostructure lasers.

In order to increase the optical confinement, it is necessary to address the small difference in the refractive index between Ge (4.03 at 2.3 μm) and GeSn (4.1~4.2 with different Sn %). To increase the mode overlap with the GeSn active layer, an overall 240-nm-thick SiGeSn cap layer was grown on top of the GeSn active layer, which pushes the peak intensity of the optical field into the active region, resulting in a 75% mode overlap with the GeSn core layer whose thickness is 1000 nm, as shown in FIG. 4B. For optically pumped laser devices, the optical field can be well confined since there is nothing but the air above the cap layer. However, for the electrically injected laser devices, due to the metal contact above the cap layer, the thickness of the SiGeSn cap needs to be carefully optimized to minimize the optical loss via the metal thin film. The current thickness is selected as a compromise of the SiGeSn growth capability and the metal optical loss.

Figure 7:
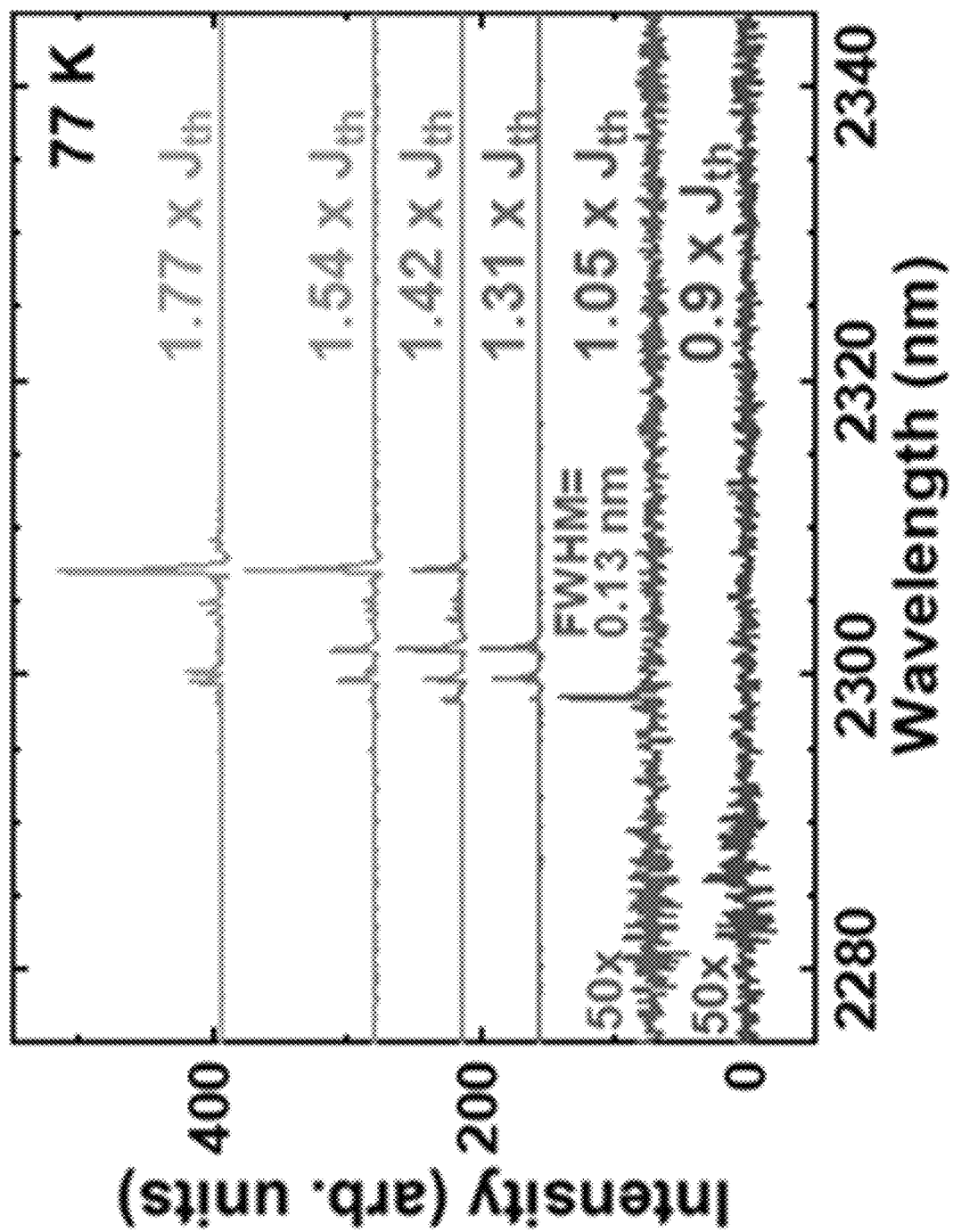
FIG. 7 shows high-resolution spectra of 0.8 mm cavity length device at 77 K under various current injections of a laser diode device according to embodiments of the invention.

The lasing spectra were further examined with the PL study of the active region. The lasing peak from the 0.8-mm cavity length device features a narrow linewidth (about 23 nm) compared to that of the PL spectrum (205 nm). In addition, the 77 K high-resolution spectra in FIG. 7 reveals the details of the spectrum, where the multiple longitudinal peaks (with sub-nanometer individual peaks) form an envelope that shown as a single peak in the low-resolution measurement. The dramatic reduction of peak linewidth indicates the onset of lasing.

Figure 8:
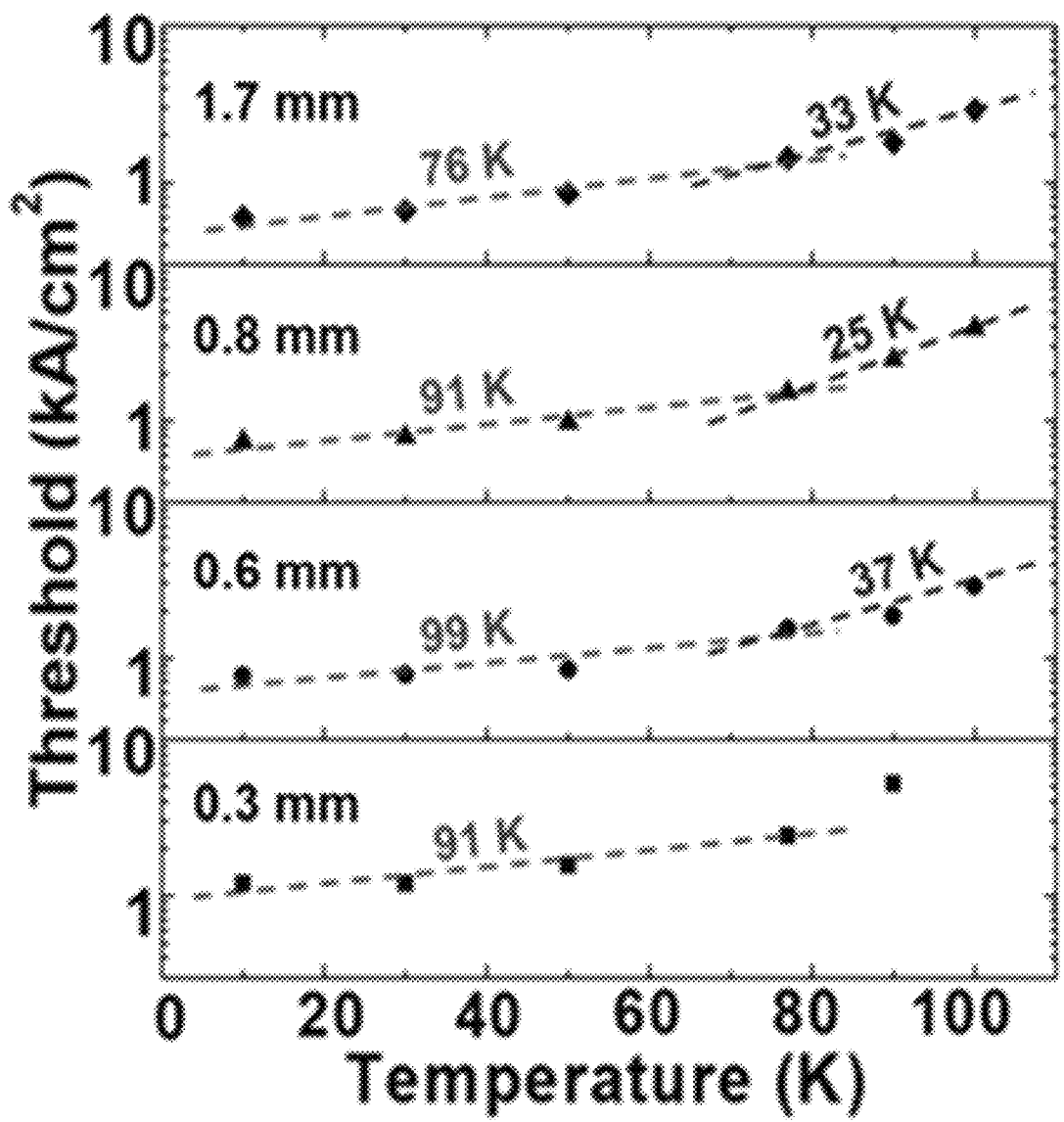
FIG. 8 shows extracted T0 for each device according to embodiments of the invention. For the 0.3 mm device, the data point of threshold at 90 K was excluded from data fitting.

$T_0$ of about 90 K in the temperature range below 77 K is comparable with earlier reported double heterostructure laser diodes. As temperature increases above 77 K, the carriers in the GeSn active region could gain sufficient thermal energy to overcome the barriers and leak into the SiGeSn cap and GeSn buffer layers, resulting in significantly increased lasing threshold. This leads to the considerably reduction of $T_0$ above 77 K, ranging from 25 to 37 K, as shown in FIG. 8. By optimizing the design of the cap and buffer layers, the improved carrier confinement at higher temperatures can be obtained and thus higher $T_0$ is expected.

Note that although 2.7 mW/facet peak power was obtained, the external quantum efficiency (EQE) was estimated as 0.3% (both facets power counted), which is relatively low even compared with early reported III-V double-heterostructure lasers. This might be attributed to the low injection efficiency due to the material band structure (close to indirect bandgap), current leakage due to poor carrier confinement, and the high internal optical loss. A thorough study will be the next step to quantitatively investigate the origin of low EQE.

To further improving the device performance, investigations of new structure designs are underway, which include: i) increasing the Sn content to increase the bandgap directness so that injection efficiency can be increased; ii) adding an SiGeSn buffer on the n layer to enhance the hole confinement; iii) improving material quality and fabrication technique to minimize the interface defects and surface roughness, so that internal optical loss can be reduced; and iv) reducing doping levels to minimize the free carrier absorption.

In sum, the electrically injected GeSn/SiGeSn heterostructure lasers were demonstrated on a Si wafer grown by using a commercial CVD reactor. The narrow peak linewidth of 0.13 nm (0.06 eV) and L-I curve characteristics evidentially confirm the lasing. The multi-mode lasing characteristics were observed by high-resolution spectra. The lasing threshold of 598 A/cm$^2$ at 10 K was obtained. The maximum lasing temperature was measured as 100 K with 2300 nm peak wavelength. The p-i-n structure design enhances the carrier confinement by reducing the hole leakage through the type-II band aligned cap layer. The peak power was measured as 2.7 mW/facet at 10 K, corresponding to calculated EQE of about 0.3%.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

REFERENCE LISTING

[1] S. Wirths, D. Buca, S. Mantl, Si—Ge—Sn alloys: From growth to applications, Prog. Cryst. Growth Ch. 62, 1-39 (2016).

[2] R. Soref, D. Buca, and S.-Q. Yu, Group IV Photonics: Driving Integrated Optoelectronics, Optics and Photonics News 27, 32-39 (2016).

[3] J. Zheng, et al., Recent progress in GeSn growth and GeSn-based photonic devices, J. Semicond. 39, 061006 (2018).

[4] R. Soref, Mid-infrared photonics in silicon and germanium, Nature Photon. 4, 495-497 (2010).

[5] X. Wang and J, Liu, Emerging technologies in Si active photonics. J. Semicond. 39, 061001 (2018).

[6] S. Wirths, et al., Lasing in direct-bandgap GeSn alloy grown on Si. Nature Photon. 9, 88-92 (2015).

[7] V. Reboud, et al., Optically pumped GeSn micro-disks with 16% Sn lasing at 3.1 µm up to 180 K, Appl. Phys. Lett. 111, 092101 (2017).

[8] J. Margetis, et al., Si-based GeSn lasers with wavelength coverage of 2-3 µm and operating temperatures up to 180 K, ACS Photonics 5, 827-833 (2017).

[9] Y. Zhou, et al., Optically Pumped GeSn Lasers Operating at 270 K with Broad Waveguide Structures on Si, ACS Photonics 6, 1434-1441 (2019).

[10] D. Stange, et al., GeSn/SiGeSn Heterostructure and Multi Quantum Well Lasers, ACS Photonics 5, 4628-4636 (2018).

[11] J. Margetis, et al., All group-IV SiGeSn/GeSn/SiGeSn QW laser on Si operating up to 90 K, Appl. Phys. Lett. 113, 221104 (2018).

[12] Q. M. Thai, et al., GeSn heterostructure micro-disk laser operating at 230 K, Opt. Express 26, 32500-32508 (2018).

[13] J. Chrétien, et al., GeSn Lasers Covering a Wide Wavelength Range Thanks to Uniaxial Tensile Strain, ACS Photonics 6, 2462-2469 (2019).

[14] A. Elbaz, et al., Ultra-low threshold cw and pulsed lasing in tensile strained GeSn alloys, Nature Photon. 14, 375-382 (2020).

[15] G. Sun, R. A. Soref, and H. H. Cheng, Design of an electrically pumped SiGeSn/GeSn/SiGeSn double-heterostructure mid-infrared laser, J. Appl. Phys. 108, 033107 (2010).

[16] G. Sun, R. A. Soref, and H. H. Cheng, Design of a Si-based lattice-matched room-temperature GeSn/GeSiSn multi-quantum-well mid-infrared laser diode, Opt. Express 18, 19957-19965 (2010).

[17] W. Dou, et al., Investigation of GeSn Strain Relaxation and Spontaneous Composition Gradient for Low-Defect and High-Sn Alloy Growth, Sci. Rep. 8, 5640 (2018).

[18] G. Sun, H. H. Cheng, J. Menendez, J. B. Khurgin, and R. A. Soref, Strain-free Ge/GeSiSn quantum cascade lasers based on L-valley intersubband transitions, Appl. Phys. Lett. 90, 251105 (2007).

[19] H. Tran, et al., Systematic study of Ge1−xSnx absorption coefficient and refractive index for the device applications of Si-based optoelectronics, J. Appl. Phys 119, 103106 (2016).

[20] Y. Zhou, et al., Systematic study of GeSn heterostructure-based light-emitting diodes towards mid-infrared applications, J. Appl. Phys. 120, 023102 (2016).

[21] H. Tran, et al., Si-based GeSn photodetectors toward mid-infrared imaging applications, ACS Photonics 6, 2807 (2019).

[22] J. Pankove, Temperature dependence of emission efficiency and lasing threshold in laser diodes, IEEE J. Quantum Electron. 4, 119-122 (1968).

[23] I. Hayashi and M. B. Panish, GaAs-GaxAl1−xAs Heterostructure Injection Lasers which Exhibit Low Thresholds at Room Temperature, J. Appl. Phys. 41, 150 (1970).

[24] I. Hayashi, M. B. Panish, and F. K. Reinhart, GaAs—$Al_xGa_{1-x}As$ Double Heterostructure Injection Lasers, J. Appl. Phys. 42, 1929 (1971).

[25] C. J. Nuese, M. Ettenberg, and G. H. Olsen, Room-temperature heterojunction laser diodes from vapor-grown In1−xGaxP/GaAs structures, Appl. Phys. Lett. 25, 612 (1974).

What is claimed is:

1. A laser diode, comprising:
   a double heterostructure (DHS) comprising a top layer, a buffer layer formed on a substrate, and an intrinsic active layer formed between the top layer and the buffer layer, wherein the top layer and the buffer layer have opposite types of conductivity, and wherein the active layer has a bandgap smaller than that of the buffer layer or the top layer,
   wherein the top layer is formed of a SiGeSn material, and the top layer is doped as a p-type.

2. The laser diode of claim 1, wherein the DHS comprises a narrower bandgap GeSn active layer and wider bandgap GeSn or SiGeSn cladding layers.

3. The laser diode of claim 1, further comprising first and second electrodes, wherein the first electrode is coupled to the top layer, the second electrode is coupled to the buffer layer or the substrate.

4. The laser diode of claim 3, wherein the substrate is heavily doped when the second electrode is coupled to the substrate.

5. The laser diode of claim 1, wherein the active layer comprises a direct bandgap GeSn bulk or quantum well (QW) structure.

6. The laser diode of claim 5, wherein the QW structure comprises single or multiple QWs.

7. The laser diode of claim 5, wherein the QW structure comprises one or more direct bandgap GeSn wells and one or more SiGeSn barriers.

8. The laser diode of claim 5, wherein the active layer is a nominally intrinsic $Ge_aSn_b$ active layer having a thickness in a range of about 50-2000 nm, with a Sn composition in the active region greater than 8%, wherein a+b=1.

9. The laser diode of claim 1, wherein each of the top layer and the buffer layer serves as a contact layer by a heavy doping level.

10. The laser diode of claim 9, wherein the buffer layer is doped as an n-type.

11. The laser diode of claim 10, wherein the buffer layer comprises one or more layers with different Sn compositions for achieving a strain relaxation.

12. The laser diode of claim 11, wherein the buffer layer comprises a first buffer layer formed of a Ge material on the substrate, and a second buffer layer formed of a GeSn and/or SiGeSn material on the first buffer layer.

13. The laser diode of claim 12, wherein the first buffer layer is a nominal strain-relaxed Ge buffer layer having a thickness less than about 2000 nm, with n-type doping of about $1 \times 10^{17}$ cm$^{-3}$.

14. The laser diode of claim 13, wherein the second buffer layer is formed of a GeSn material and/or a SiGeSn material and has a thickness less than about 2000 nm, with n-type doping of about $1 \times 10^{17}$ cm$^{-3}$.

15. The laser diode of claim 1, wherein the top layer comprises one or more layers including a first top layer formed on the active layer, and a second top layer formed on the first top layer and doped heavily relative to the first top layer.

16. The laser diode of claim 15, wherein the first top layer is a $Si_xGe_ySn_z$ cap layer having a thickness less than about 2000 nm, with p-type doping of about $1 \times 10^{17}$ cm$^{-3}$, and the second top layer is a $Si_xGe_ySn_z$ Ohmic contact layer having a thickness less than about 2000 nm, with p-type doping of about $1 \times 10^{19}$ cm$^{-3}$, wherein x+y+z=1.

17. The laser diode of claim 10, wherein when holes are injected from a top of the top layer, hole barriers in a valance band between the active layer and the buffer layer confines the holes in the active region to facilitate population inversion.

18. The laser diode of claim 10, wherein when electrons are injected from a bottom of the buffer layer, electron barriers in Γ valley that is lower band than L valley in a conduction band between the active layer and the top layer prevents leakage of electrons, thereby confining the electrons in the active region.

19. The laser diode of claim 10, wherein the DHS has a p-i-n structure configured to minimize hole leakage and enhance carrier confinement.

20. The laser diode of claim 1, wherein the top layer is designed as a type-I band alignment to the active region, and the DHS has a p-i-n or n-i-p structure.

21. The laser diode of claim 20, wherein the type-I band alignment is achieved by designing the top layer lattice match or compressively strained on the active region.

22. The laser diode of claim 1, wherein the top layer is designed as a type-II band alignment to the active region, the DHS has a p-i-n structure.

23. A method of forming a laser diode, comprising:
   growing a laser diode structure via a chemical vapor deposition reactor using precursors of $SiH_4$ (or $Si_3H_8$), $GeH_4$ (or $Ge_2H_6$), and/or $SnCl_4$ (or $SnD_4$) on a substrate,
   wherein the laser diode structure comprises a double heterostructure (DHS) comprising a buffer layer grown on the substrate, an intrinsic active layer frown on the buffer layer, and a top layer grown in the buffer layer, wherein the top layer and the buffer layer are doped to have opposite types of conductivity, and wherein the active layer has a bandgap smaller than that of the buffer layer or the top layer,
   wherein the top layer is formed of a SiGeSn material, and the top layer is doped as a p-type.

24. The method of claim 23, wherein the buffer layer comprises a nominal strain-relaxed Ge buffer layer grown on the substrate, having a thickness less than about 2000 nm, with n-type doping of about $1 \times 10^{17}$ cm$^{-3}$, and a GeSn/SiGeSn buffer layer grown on the nominal strain-relaxed Ge buffer layer, having a thickness less than about 2000 nm, with n-type doping of about $1 \times 10^{17}$ cm$^{-3}$.

25. The method of claim 24, wherein the active layer is a nominally intrinsic $Ge_aSn_b$ active layer grown on the GeSn buffer layer, having a thickness in a range of about 50-2000 nm, wherein a+b=1.

26. The method of claim 25, wherein the top layer comprises a first $Si_xGe_ySn_z$ cap layer grown on the nominally intrinsic $Ge_aSn_b$ active layer, having a thickness less than about 2000 nm, with p-type doping of about $1\times10^{17}$ cm$^{-3}$, and a second $Si_xGe_ySn_z$ Ohmic contact layer grown on the first $Si_xGe_ySn_z$ cap layer, having a thickness less than 2000 nm, with p-type doping of about $1\times10^{19}$ cm$^{-3}$, wherein x+y+z=1.

27. The method of claim 26, wherein all doping growth is performed in-situ by introducing corresponding doping gases.

28. The method of claim 23, further comprising forming an electrode on each of the top layer, the buffer layer and the substrate.

* * * * *